United States Patent
Young

(10) Patent No.: US 11,817,895 B2
(45) Date of Patent: *Nov. 14, 2023

(54) METHODS RELATED TO RADIO-FREQUENCY FILTERS ON SILICON-ON-INSULATOR SUBSTRATE

(71) Applicant: SKYWORKS SOLUTIONS, INC., Irvine, CA (US)

(72) Inventor: James Phillip Young, Cedar Rapids, IA (US)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/666,446

(22) Filed: Feb. 7, 2022

(65) Prior Publication Data

US 2022/0255577 A1    Aug. 11, 2022

Related U.S. Application Data

(63) Continuation of application No. 16/819,142, filed on Mar. 15, 2020, now Pat. No. 11,245,433, which is a
(Continued)

(51) Int. Cl.
*H04B 1/40* (2015.01)
*H01L 23/498* (2006.01)
(Continued)

(52) U.S. Cl.
CPC ......... *H04B 1/40* (2013.01); *H01L 23/49827* (2013.01); *H01L 23/66* (2013.01);
(Continued)

(58) Field of Classification Search
None
See application file for complete search history.

(56) References Cited

U.S. PATENT DOCUMENTS

| 6,072,233 A | 6/2000 | Corisis et al. |
| 6,943,454 B1 | 9/2005 | Gulachenski et al. |

(Continued)

FOREIGN PATENT DOCUMENTS

| CN | 101044618 | 9/2007 |
| CN | 102034742 | 4/2011 |

(Continued)

*Primary Examiner* — Michelle Mandala
*Assistant Examiner* — Jordan M Klein
(74) *Attorney, Agent, or Firm* — Chang & Hale LLP

(57) ABSTRACT

Methods related to radio-frequency (RF) filters on silicon-on-insulator (SOI) substrate. In some embodiments, a method of manufacturing a radio-frequency device can include providing a semiconductor die including a radio-frequency circuit, a first side and a second side, and a plurality of vias, each via configured to provide an electrical connection between the first side and the second side of the semiconductor die. The method can further include mounting a filter device on the first side of the semiconductor die, the filter device in communication with the radio-frequency circuit, the radio-frequency circuit implemented in a layer on the first side of the semiconductor die and at least some of the vias coupled with the radio-frequency circuit to support an electrical connection between the radio-frequency circuit and mounting features on the second side of the semiconductor die.

20 Claims, 12 Drawing Sheets

Related U.S. Application Data continuation of application No. 15/192,812, filed on Jun. 24, 2016, now Pat. No. 10,594,355.

(60) Provisional application No. 62/187,174, filed on Jun. 30, 2015.

(51) Int. Cl.
*H01L 23/66* (2006.01)
*H01L 23/00* (2006.01)
*H01L 25/065* (2023.01)

(52) U.S. Cl.
CPC .......... *H01L 24/92* (2013.01); *H01L 25/0655* (2013.01); *H01L 24/13* (2013.01); *H01L 24/16* (2013.01); *H01L 24/17* (2013.01); *H01L 2223/6616* (2013.01); *H01L 2223/6655* (2013.01); *H01L 2223/6677* (2013.01); *H01L 2224/131* (2013.01); *H01L 2224/133* (2013.01); *H01L 2224/13025* (2013.01); *H01L 2224/1329* (2013.01); *H01L 2224/13144* (2013.01); *H01L 2224/13147* (2013.01); *H01L 2224/16145* (2013.01); *H01L 2224/16146* (2013.01); *H01L 2224/16227* (2013.01); *H01L 2224/17181* (2013.01); *H01L 2224/92222* (2013.01); *H01L 2924/15311* (2013.01)

(56) References Cited

U.S. PATENT DOCUMENTS

| | | |
|---|---|---|
| 8,922,294 B2 | 12/2014 | Tsuzuki et al. |
| 10,594,355 B2 | 3/2020 | Young |
| 11,245,433 B2 * | 2/2022 | Young .............. H01L 23/49827 |
| 2002/0153616 A1 | 10/2002 | Kunihisa et al. |
| 2004/0130037 A1 | 7/2004 | Mishra et al. |
| 2004/0245891 A1 | 12/2004 | Kawachi et al. |
| 2006/0255459 A1 | 11/2006 | Muff et al. |
| 2007/0176298 A1 | 8/2007 | Osone et al. |
| 2011/0068433 A1 | 3/2011 | Kim et al. |
| 2011/0084358 A1 | 4/2011 | Kim et al. |
| 2012/0181898 A1 | 7/2012 | Hatakeyama et al. |
| 2012/0280366 A1 | 11/2012 | Kamgaing et al. |
| 2012/0313173 A1 | 12/2012 | Dickey et al. |
| 2013/0020702 A1 | 1/2013 | Zhai et al. |
| 2014/0176368 A1 | 6/2014 | Kamgaing et al. |
| 2014/0252568 A1 | 9/2014 | Hwang et al. |
| 2014/0307592 A1 | 10/2014 | Khlat |
| 2015/0289360 A1 | 10/2015 | Leong et al. |
| 2017/0141058 A1 | 5/2017 | Lee et al. |

FOREIGN PATENT DOCUMENTS

| | | |
|---|---|---|
| CN | 103297082 | 9/2013 |
| CN | 104471864 | 3/2015 |
| TW | 201618460 | 5/2016 |
| WO | 2016/022125 | 2/2016 |

\* cited by examiner

METHODS RELATED TO RADIO-FREQUENCY FILTERS ON SILICON-ON-INSULATOR SUBSTRATE

CROSS-REFERENCE TO RELATED APPLICATION(S)

This application is a continuation of U.S. patent application Ser. No. 16/819,142, filed Mar. 15, 2020, entitled "DEVICES AND METHODS RELATED TO RADIO-FREQUENCY FILTERS ON SILICON-ON-INSULATOR SUBSTRATE," which is a continuation of U.S. patent application Ser. No. 15/192,812, filed Jun. 24, 2016, entitled "DEVICES AND METHODS RELATED TO RADIO-FREQUENCY FILTERS ON SILICON-ON-INSULATOR SUBSTRATE," now U.S. Pat. No. 10,594,355, issued Mar. 17, 2020, which claims priority to U.S. Provisional Application No. 62/187,174, filed Jun. 30, 2015, entitled "DEVICES AND METHODS RELATED TO RADIO-FREQUENCY FILTERS ON SILICON-ON-INSULATOR SUBSTRATE," the disclosure of each of which is hereby expressly incorporated by reference herein in its entirety.

BACKGROUND

Field

The present disclosure relates to, among others, radio-frequency (RF) filters on silicon-on-insulator (SOI) substrate.

Description of the Related Art

In some radio-frequency (RF) applications, a signal received or transmitted through an antenna can be routed to different amplification paths through band selection switches and respective filters. In such applications, it is desirable to minimize or reduce degradation of the signal.

SUMMARY

According to a number of implementations, the present disclosure relates to a radio-frequency (RF) device that includes a silicon die including a first side and a second side, and a plurality of vias, with each via configured to provide an electrical connection between the first side and the second side of the silicon die. The RF device further includes at least one RF flip chip mounted on the first side of the silicon die.

In some embodiments, the second side of the silicon die can be configured to be mountable in a flip-chip manner. The second side of the silicon die can include a plurality of bump solders, with at least some of the bump solders being electrically connected to respective ones of the plurality of vias.

In some embodiments, the silicon die can include a silicon-on-insulator (SOI) substrate. The SOI substrate can include an insulator layer interposed between an active silicon layer and a silicon substrate layer.

In some embodiments, the silicon die can include an RF circuit in communication with the RF flip chip. The RF circuit can include a switch circuit. The RF circuit can further include a logic circuit for the switch circuit. The RF circuit can further include a passive component. The passive component can include one or more of a capacitance, an inductance, and a resistance.

In some embodiments, the RF circuit can further include one or more of a low-noise amplifier (LNA) circuit and a power amplifier (PA) circuit.

In some embodiments, the RF circuit can include a band-selection circuit configured to route a received RF signal to a selected low-noise amplifier (LNA). In some embodiments, the received RF signal can be routed through a filter prior to the selected LNA, with the filter being implemented in the RF flip chip. In some embodiments, the received RF signal can be routed through a filter after the selected LNA, with the filter being implemented in the RF flip chip.

In some embodiments, the RF circuit can be part of an LNA module. In some embodiments, the RF circuit can be part of a diversity receive (RX) module.

In some embodiments, the RF circuit can be implemented at or near the first side of the silicon die. At least some of the vias can be coupled with the RF circuit to facilitate an electrical connection between the RF circuit and mounting features on the second side of the silicon die.

In some embodiments, the RF circuit can be implemented at or near the second side of the silicon die. At least some of the vias can be coupled with the RF circuit to allow communication between the RF circuit and the RF flip chip mounted on the second side of the silicon die.

In some embodiments, the RF flip chip can include an RF filter. The RF filter can be a surface acoustic wave (SAW) filter or a bulk acoustic wave (BAW) filter. The silicon die can include an RF circuit in communication with the SAW filter. The RF circuit can include a low-noise amplifier (LNA).

According to some teachings, the present disclosure relates to a method for fabricating a radio-frequency (RF) device. The method includes forming or providing a silicon wafer that includes a first side and a second side. The silicon wafer further includes a plurality of vias, with each via being configured to provide an electrical connection between the first side and the second side of the silicon wafer. The method further includes mounting a plurality of RF flip chips on the first side of the silicon wafer. The method further includes singulating the silicon wafer into a plurality of die units, with each die unit including at least one RF flip chip mounted on the first side.

In some implementations, the present disclosure relates to a radio-frequency (RF) module that includes a packaging substrate configured to receive a plurality of components, and a wafer level chip scale package (WLCSP) mounted on the packaging substrate. The WLCSP has a silicon die that includes a first side and a second side. The silicon die further includes a plurality of vias, with each via being configured to provide an electrical connection between the first side and the second side of the silicon die. The WLCSP further includes at least one RF flip chip mounted on the first side of the silicon die.

In some embodiments, the silicon die can include an RF circuit in communication with the RF flip chip. The WLCSP can have a lateral dimension that is less than 20% of a lateral area of a package with a silicon die with a similar RF circuit and a similar number of RF flip chips mounted on a packaging substrate instead of the silicon die. The WLCSP can have a height that is less than the height of the package. The height of the WLCSP can be less than ⅔ of the height of the package, such that the overall volume of the WLCSP is less than approximately 20% of the overall volume of the package.

In some embodiments, the RF flip chip can include a filter circuit. The RF circuit can include a low-noise amplifier (LNA). The RF module can be, for example, a GPS module, an LNA module, or a diversity receive (RX) module.

In accordance with a number of implementations, the present disclosure relates to a wireless device that includes an antenna configured to receive an RF signal, and a receiver in communication with the antenna and configured to process the received RF signal. The wireless device further includes an RF module configured to route the received RF from the antenna to the receiver. The RF module includes a wafer level chip scale package (WLCSP) having a silicon die that includes a first side and a second side. The silicon die further includes a plurality of vias, with each via being configured to provide an electrical connection between the first side and the second side of the silicon die. The WLCSP further includes at least one RF flip chip mounted on the first side of the silicon die.

In some teachings, the present disclosure relates to a device that includes a semiconductor die having a first side and a second side. The semiconductor die further includes a plurality of vias, with each via being configured to provide an electrical connection between the first side and the second side of the semiconductor die. The semiconductor die further includes an active integrated circuit (IC). The device further includes a flip chip device mounted on the first side of the semiconductor die. The flip chip device includes a signal conditioning circuit.

In some embodiments, the signal conditioning circuit can be a passive circuit. In some embodiments, the signal conditioning circuit can be a filter circuit.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

DETAILED DESCRIPTION OF SOME EMBODIMENTS

The headings provided herein, if any, are for convenience only and do not necessarily affect the scope or meaning of the claimed invention.

Figure 1:
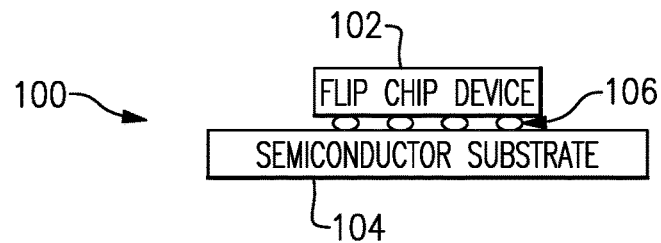
FIG. 1 shows a flip chip device mounted on a semiconductor substrate.
Figure 2:
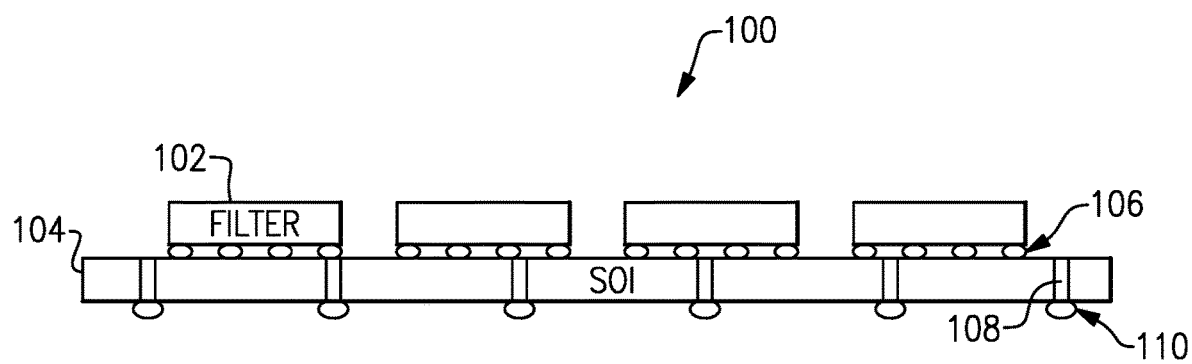
FIG. 2 shows an example of a flip chip device as a filter device such as a radio-frequency (RF) filter, and a semiconductor substrate as a silicon-on-insulator (SOI) substrate.

Described herein are various examples of devices and methods related to one or more flip chip devices mounted on a semiconductor substrate. Such a configuration (100) is depicted in FIG. 1, where a flip chip device 102 is shown to be mounted on a semiconductor substrate 104 with, for example, bump solders 106. FIG. 2 shows a more specific example configuration 100 where the flip chip device (102 in FIG. 1) can be a filter device 102 such as a radio-frequency (RF) filter; and where the semiconductor substrate (104 in FIG. 1) can be a silicon-on-insulator (SOI) substrate 104.

Various examples are described herein in the context of filters and SOI substrates. However, it will be understood that one or more features of the present disclosure can also be implemented with other types of flip chip devices and/or semiconductor substrates. In some embodiments, semiconductor substrates such as complementary metal-oxide-semiconductor (CMOS) and silicon-germanium (SiGe) BiCMOS can also be utilized. In some embodiments, semiconductor substrates can include gallium arsenide (GaAs) and other compound semiconductor substrates, including, for example, GaAs heterojunction bipolar transistor (HBT), BiHEMT (e.g., integration of HBT and pseudomorphic high-electron-mobility transistor (pHEMT)), GaAs BiHEMT, GaAs pHEMT, and gallium nitride (GaN). In some embodiments, other substrates can be utilized, including, for example, quartz, polymer materials, silicon carbide, sapphire, diamond, germanium, etc. In some embodiments, active electronic and/or semiconductor devices can be implemented on or within a substrate or a layer that is formed over such a substrate. In some embodiments (e.g., quartz) passive devices (e.g., capacitors, resistors, inductors, etc.) can be implemented on or within a substrate.

In the context of filters, the flip chip devices can include, for example, surface acoustic wave (SAW) filters, bulk acoustic wave (BAW) filters, and thin-film bulk acoustic resonators (FBAR or TFBAR). For the purpose of description herein, it will be understood that filters can include related devices such as duplexers. As described herein, filters such as the foregoing examples are utilized to, for example, condition RF signals at desired locations relative to related circuits. Accordingly, it will be understood that one or more features of present disclosure can also be implemented with one or more signal conditioning flip chip devices that may or may not include filters, being mounted on a semiconductor substrate such as an SOI substrate.

FIG. 2 shows that in some embodiments, one or more filters 102 can be flip-chip mounted (e.g., with bump solders 106) on an SOI substrate 104. Such filters can be mounted on a front side or a back side of the SOI substrate. Examples of both configurations are described herein in greater detail. For the purpose of description, the front side can be the side where one or more integrated circuits and/or passive components are formed or provided; and the back side can be the opposite side.

In some embodiments, the side of the SOI substrate 104 without the filter(s) 102 can be configured to be flip-chip mountable onto, for example, a circuit board such as a phone board. In the example shown, bump solders 110 can be formed on the non-filter side to allow such flip-chip mounting. Conductive vias 108 can be formed through or partially-through the SOI substrate 104 so as to provide electrical connections between at least some of the bump solders 110 and one or more circuits that are part of the SOI substrate 104. Examples of such circuits are described herein in greater detail. Although various flip-chip mounting examples are described herein in the context of bump solders, it will be understood that other mounting techniques can also be implemented. For example, copper pillars or gold bumps with anisotropic conductive epoxies, etc. can be utilized.

A device configured in the foregoing manner can allow an SOI substrate to include circuits such as RF switches, low-noise amplifiers (LNAs), power amplifiers (PAs), and/or passive components (e.g., capacitors and inductors); and also have filters flip-chip mounted thereon. Because of the filters being stacked on the SOI substrate, a number of advantageous features can be realized. For example, the overall footprint size of the SOI circuits and the corresponding filters can be reduced greatly, since some or all of the filters can be positioned on the SOI substrate rather than beside the SOI substrate on a common plane. Further, the flip-chip mounting of the filters on the SOI substrate can significantly reduce the amount of electrical connection features (e.g., metal traces), thereby minimizing or reducing signal loss between the SOI circuits and the filters. Aside from the foregoing, other benefits can include, for example, reduced parasitics, and improved performance.

In the example of FIG. 2, the bump solders 110 and the corresponding conductive vias 108 can allow the SOI circuits and the filters to be collectively configured and packaged as a flip chip surface mountable component. In some embodiments, the SOI substrate can be configured to be mountable in other manners, including surface mounting with wirebond connections.

Figure 3:
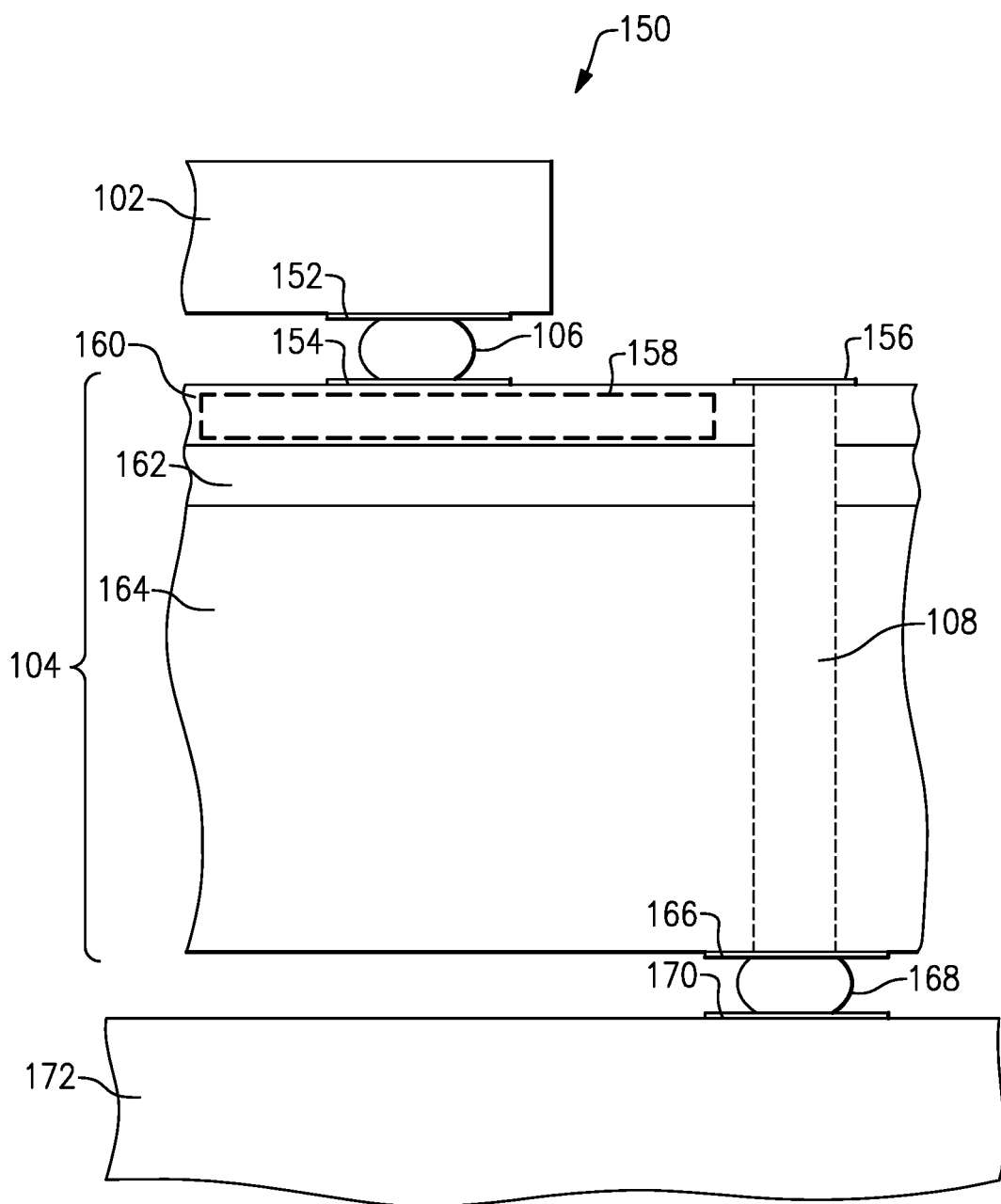
FIG. 3 shows a more detailed example of the filter-SOI assembly of FIG. 2.
Figure 4:
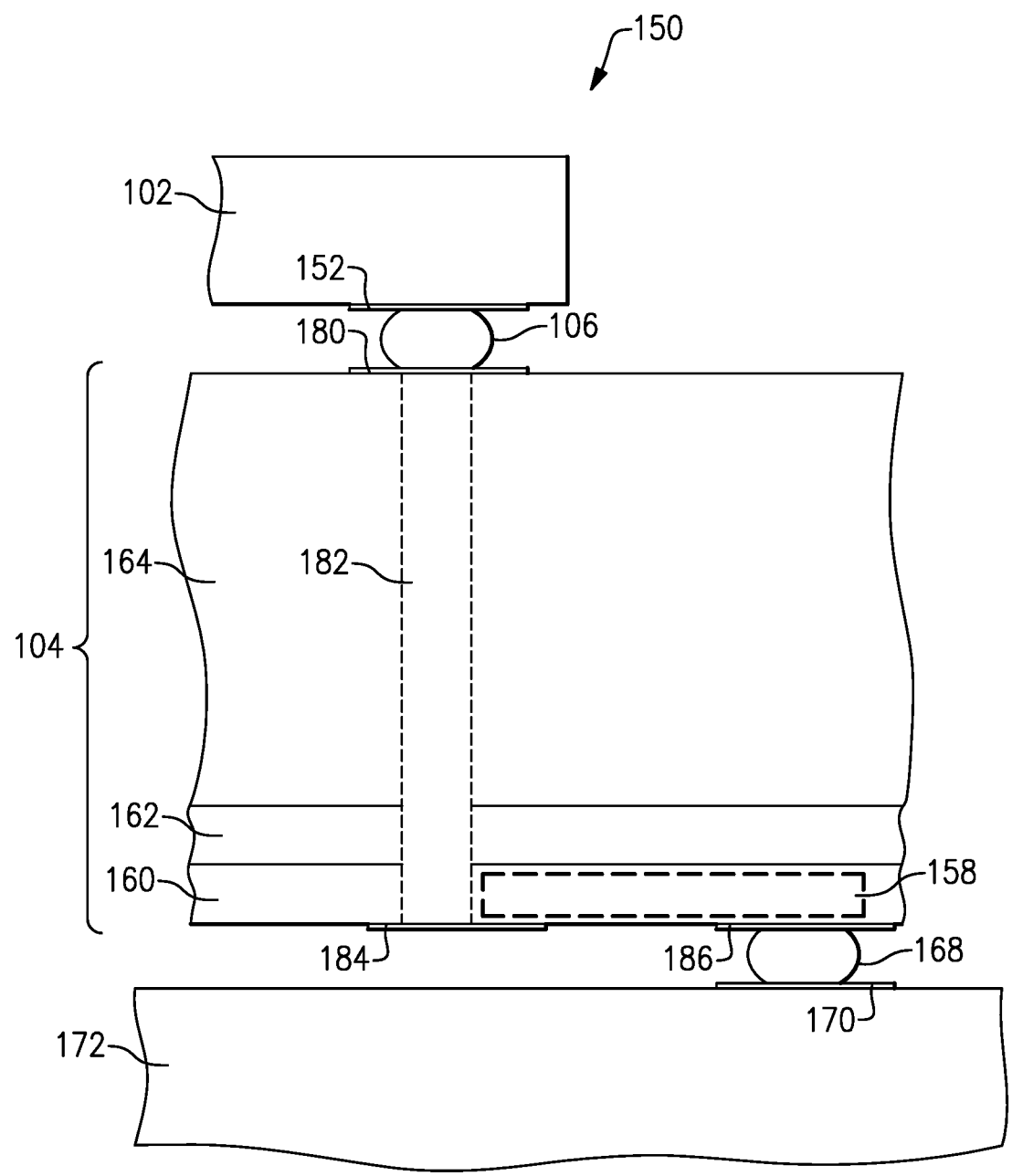
FIG. 4 shows another more detailed example of the filter-SOI assembly of FIG. 2.

FIGS. 3 and 4 show more detailed examples of the filter-SOI assembly 100 of FIG. 2. In an example configuration 150 of FIG. 3, a filter 102 is shown to be mounted on the front side of an SOI substrate 104, with the front side having an active silicon layer 160 on which an integrated circuit (IC) 158 is formed. Interposed between the active silicon layer 160 and a silicon substrate layer 164 is an insulator layer 162 to generally form the SOI structure.

In FIG. 3, an example bump solder 106 is shown to provide mechanical mounting functionality as well as an electrical connection between contact pads 152 (on the filter 102) and 154 (on the SOI substrate 104). The contact pad 152 can be electrically connected to a filtering circuit of the filter 102. Similarly, the contact pad 154 can be electrically connected to the IC 158 so as to electrically connect the filtering circuit with the IC 158.

The IC 158 can also be electrically connected to a conductor 156 which is in turn electrically connected to a through-substrate conductive via 108. On the back side of the SOI substrate 104, the via 108 is shown to be in electrically connected to a contact pad 166. A bump solder 168 can allow the SOI substrate 104 to be mounted to another layer 172 (through a contact pad 170) such as a circuit board or a packaging substrate. Accordingly, the via 108 can provide an electrical connection between the IC 158 and a location on the layer 172, such as a circuit.

In some embodiments, it may be desirable to configure the via 108 (e.g., a conductive through-wafer via (TWV)) to be electrically isolated from a conductive portion of the substrate. For example, in the context of the foregoing SOI substrate, the conductive via 108 can pass through the silicon substrate layer 164 which is typically a conductive substrate. Thus, to electrically isolate one via from another, an insulator (e.g., $SiO_2$ liner) can be provided between the via 108 and the silicon substrate layer 164. The insulator layer 162 is an insulator, and the active silicon layer 160 usually includes processing structures that can isolate various structures; accordingly, electrical isolation of the via 108 can be provided or facilitated by such features. In some embodiments, electrical isolation of the via 108 may not be needed.

In the example of FIG. 3, the flip-chip mounting of the filter 102 on the front side of the SOI substrate 104 allows the filter 102 to be close to the IC 158 to yield beneficial features as described herein. In some situations, it may be desirable to position the filter (102) away from the IC (158). For example, there may be isolation and/or mechanical design considerations where having the filter (102) on the back side (e.g., the side opposite from the active silicon layer 160) is preferable.

FIG. 4 shows an example configuration 150 in which a filter 102 is mounted on the back side of an SOI substrate 104, with the front side having an active silicon layer 160 on which an IC 158 is formed. Interposed between the active silicon layer 160 and a silicon substrate layer 164 is an insulator layer 162 to generally form the SOI structure. The front side of the SOI substrate 104 is shown to be mounted to another layer 172 (through a contact pad 186, a bump solder 168, and a contact pad 170) such as a circuit board or a packaging substrate. The contact pad 186 on the front side can be electrically connected to the IC 158, such that the foregoing mounting through the bump solder 168 provides an electrical connection between the IC 158 and a location on the layer 172.

In FIG. 4, an example bump solder 106 is shown to provide mechanical mounting functionality as well as an electrical connection between a contact pad 152 of the filter 102 and a contact pad 180 on the back side of the SOI substrate 104. The contact pad 152 can be electrically connected to a filtering circuit of the filter 102. Similarly, the contact pad 180 can be electrically connected to the IC 158 through a conductive via 182 and a conductor 184 on the front side of the SOI substrate 104, so as to electrically connect the filtering circuit with the IC 158. In some embodiments, various conductor features such as the via 182 can be configured to yield a desired property such as an interconnect inductance to provide, for example, conditioning of RF signals between various locations of the device.

Figure 5A:
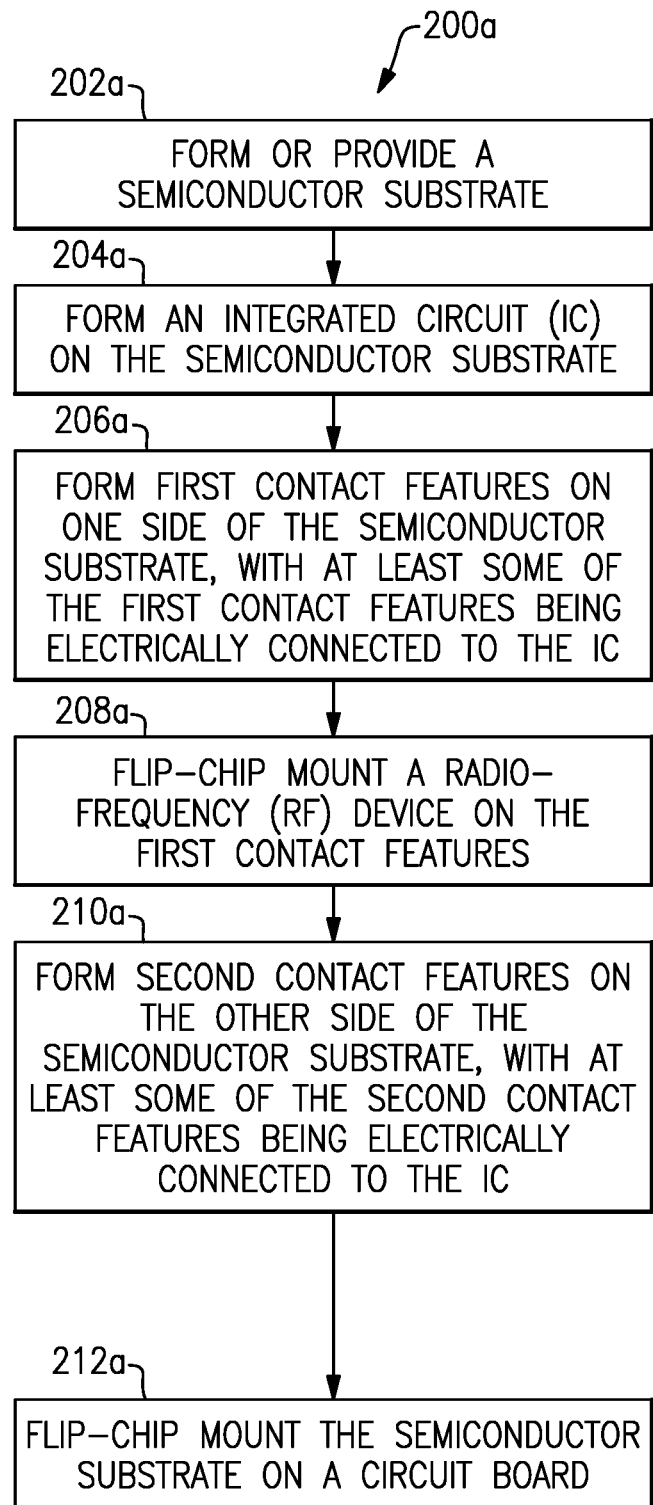
FIGS. 5A and 5B show example processes that can be implemented to fabricate devices having one or more features as described herein.
Figure 5B:
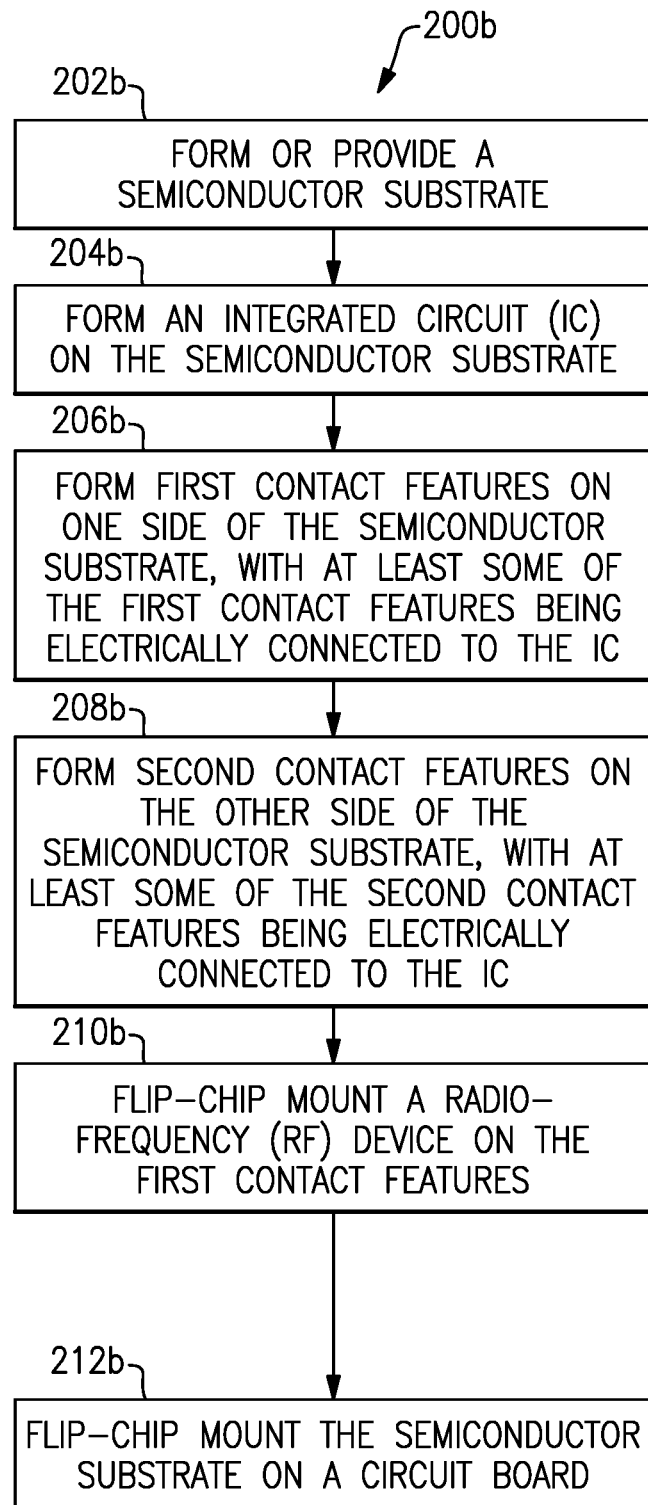

FIGS. 5A and 5B show examples of processes 200a and 200b respectively, that can be implemented to fabricate a device having a configuration 100 of FIG. 1. Referring to FIGS. 5A and 5B, in both blocks 202a and 202b, a semiconductor substrate can be formed or provided. In both blocks 204a and 204b, an integrated circuit (IC) and/or a passive component can be formed on the semiconductor substrate. In both blocks 206a and 206b, a plurality of first contact features can be formed on one side of the semiconductor substrate, with at least some of the first contact features being electrically connected to the IC. Referring to FIG. 5A, in block 208a, an RF device can be flip-chip mounted on the first contact features. Also in FIG. 5A, and in block 210a, a plurality of second contact features can be formed on the other side of the semiconductor substrate, with at least some of the second contact features being electrically connected to the IC. Referring to FIG. 5B, in block 208b, a plurality of second contact features can be formed on the other side of the semiconductor substrate, with at least some of the second contact features being electrically connected to the IC, and in block 210b, an RF device can be flip-chip mounted on the first contact features.

Each process of FIGS. 5A and 5B further shows that a device fabricated in the foregoing manner can be mounted on a circuit board such as a phone board. For example, in both blocks 212a and 212b, the semiconductor substrate can be flip-chip mounted on the circuit board.

Figure 6A:
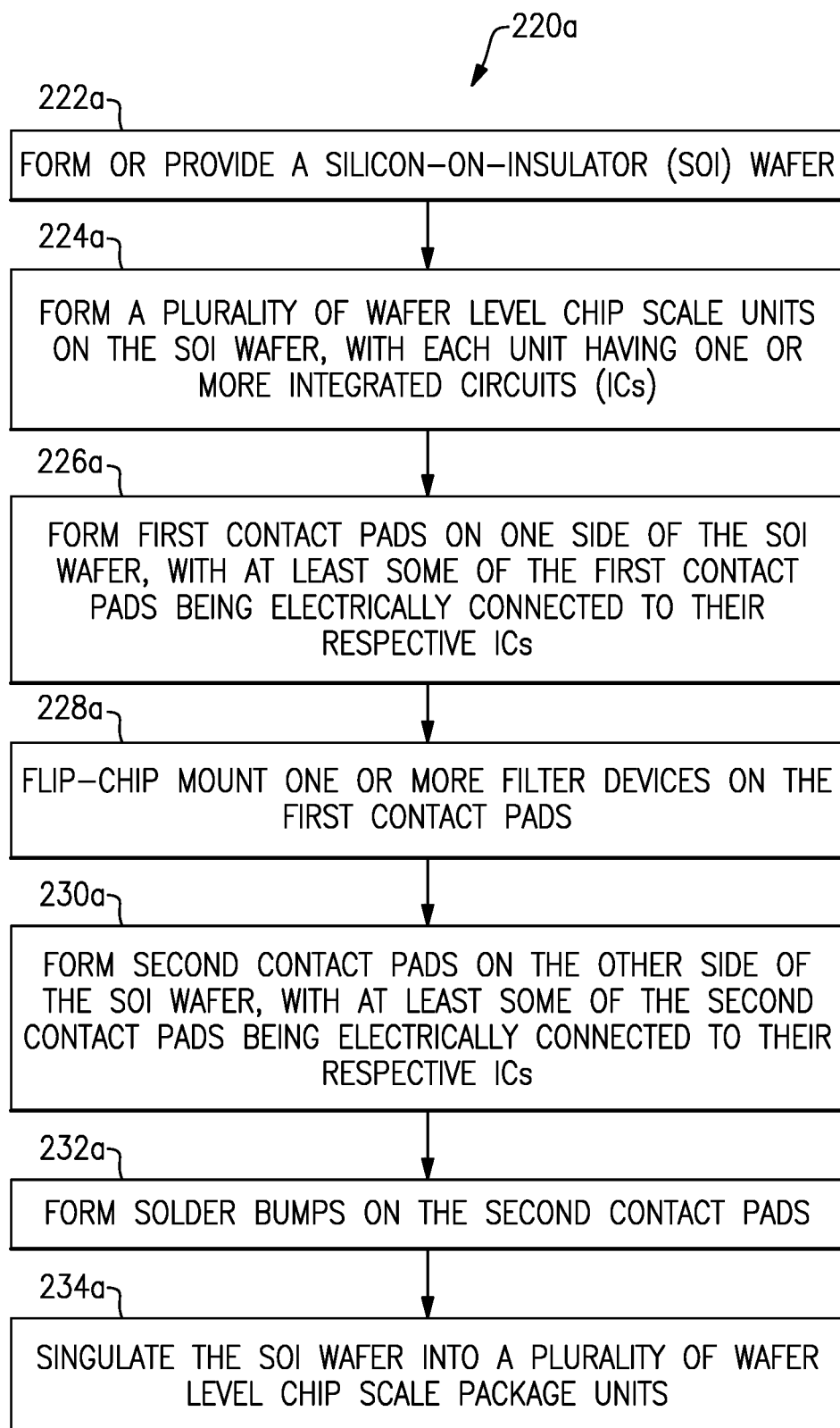
FIGS. 6A and 6B show example processes that can be implemented as more specific examples of the processes of FIGS. 5A and 5B, to fabricate filter-on-SOI substrate devices.
Figure 6B:
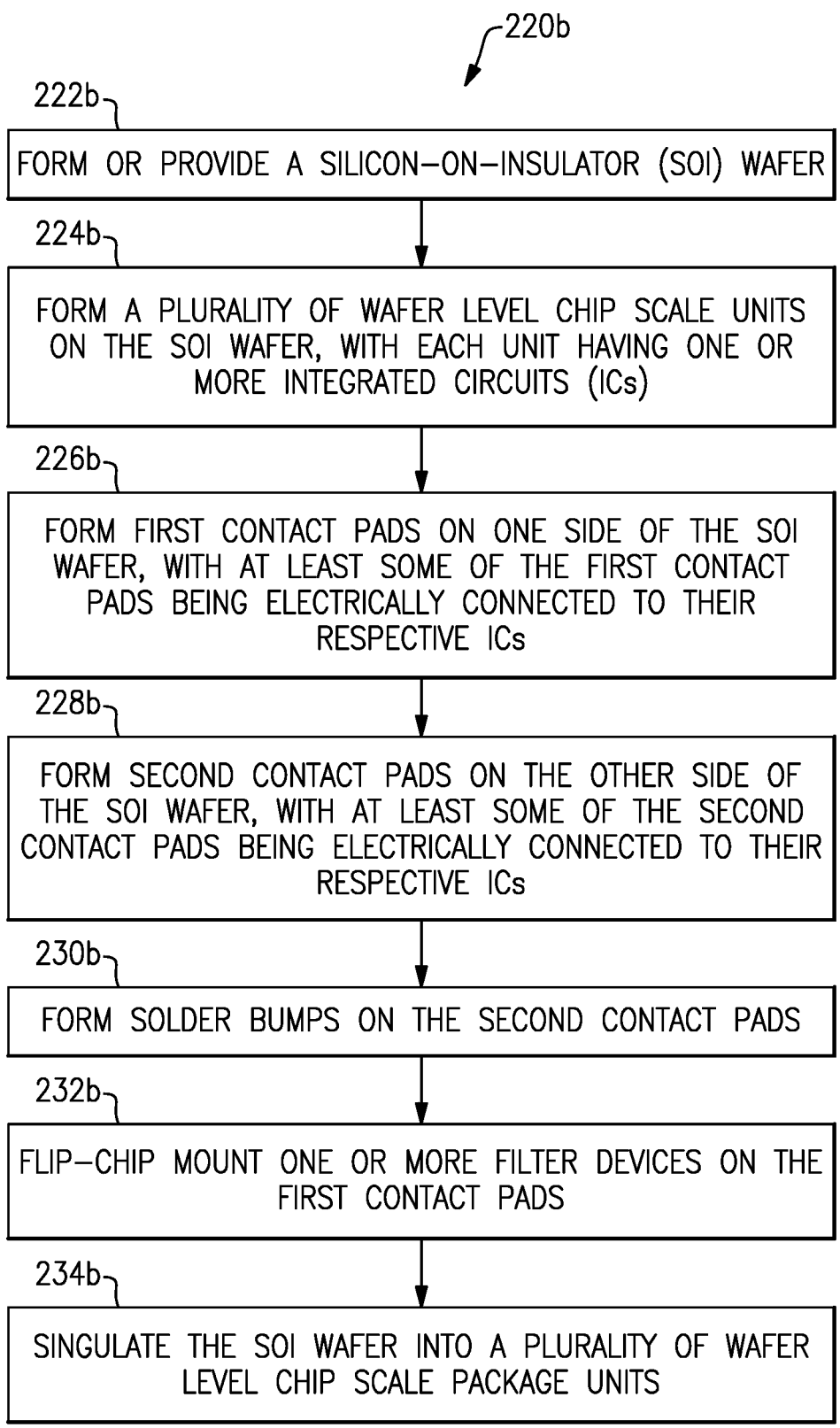

FIGS. 6A and 6B show examples processes 220a and 220b respectively, that can be implemented as more specific examples of the processes 200a and 200b of FIGS. 5A and 5B respectively, to fabricate a plurality of filter-on-SOI substrate devices. Referring to FIGS. 6A and 6B, in both blocks 222a and 222b, an SOI wafer can be formed or provided. In both blocks 224a and 224b, a plurality of wafer level chip scale units can be formed on the SOI wafer, with each unit having one or more ICs and/or one or more passive components. In both blocks 226a and 226b, a plurality of first contact pads can be formed on one side of the SOI wafer, with at least some of the first contact pads being electrically connected to their respective ICs. Referring to FIG. 6A, in block 228a, one or more filter devices can be flip-chip mounted on the first contact pads, and in block 230a, a plurality of second contact pads can be formed on the other side of the SOI wafer, with at least some of the second contact pads being electrically connected to their respective ICs. Also in FIG. 6A, in block 232a, solder bumps can be formed on the second contact pads. Referring to FIG. 6B, in block 228b, a plurality of second contact pads can be formed on the other side of the SOI wafer, with at least some of the second contact pads being electrically connected to their respective ICs, and in block 230b, solder bumps can be formed on the second contact pads. Also in FIG. 5B, and in block 232b, one or more filter devices can be flip-chip mounted on the first contact pads. In the example of FIG. 6B, block 232b can also be performed before block 230b. In each of FIGS. 6A and 6B, in blocks 234a and 234b, the SOI wafer can be singulated into a plurality of wafer level scale package (WLCSP) units.

Figure 7:
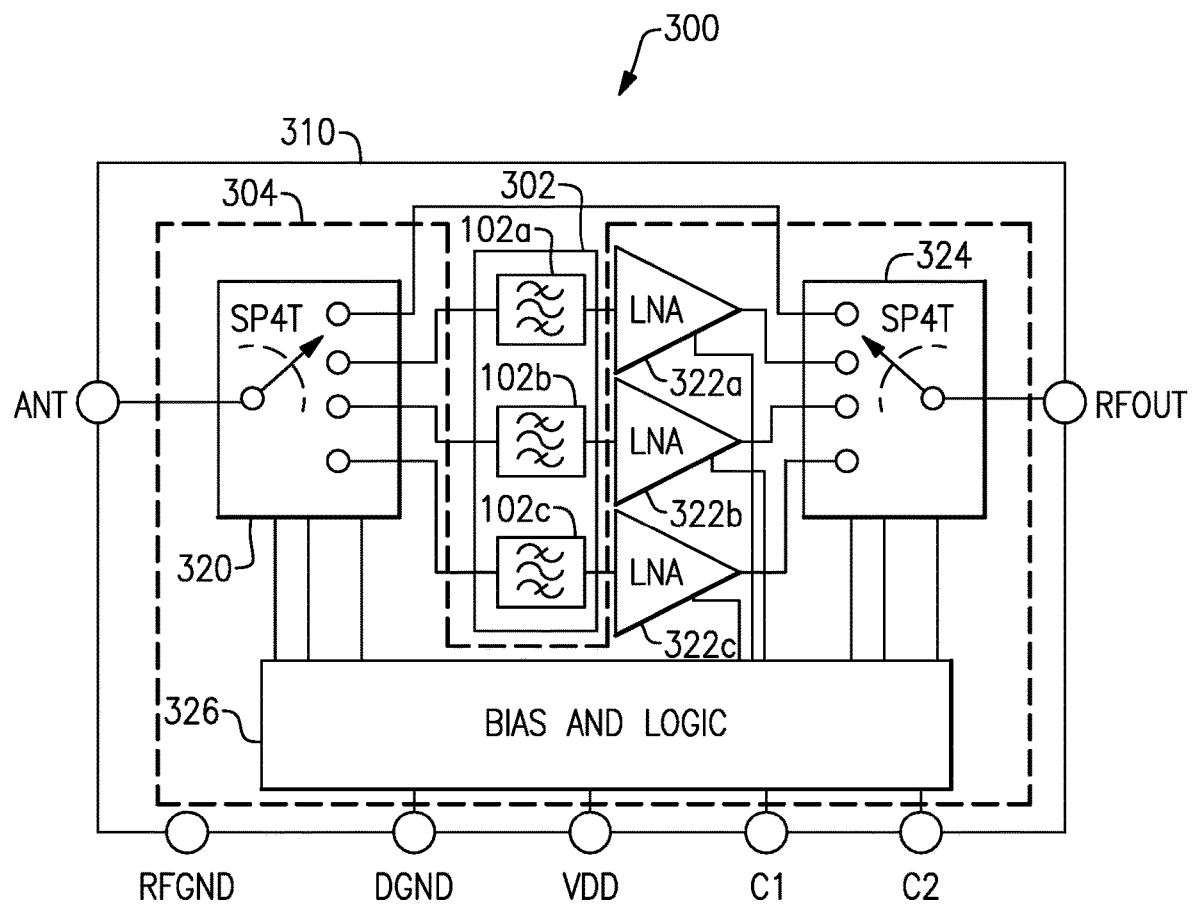
FIG. 7 shows a band-selection switching circuit for a low-noise amplifier (LNA) as an example of RF applications for which filter-on-SOI configurations as described herein can be implemented.

FIGS. 7-12 show examples of RF applications for which filter-on-SOI configurations as described herein can be implemented. FIG. 7 shows an example of a band-selection switching circuit 300 for a low-noise amplifier (LNA). In the example, a pole of a first switch 320 is shown to be connected to an antenna port (ANT) for receiving an RF signal. Four example throws of the first switch 320 are shown to allow routing of the RF signal to four different paths, with each of the first to third paths including its respective filter (102a, 102b or 102c) and LNA (322a, 322b or 322c), and the fourth path being a bypass path. Although not shown in FIG. 7, filters can also be provided after the LNAs (322a, 322b, 322c). Four throws of a second switch 324 are shown to allow connection of the four different paths to an output port (RFOUT). Bias signals for the LNAs (322a, 322b, 322c), as well as logic signals for the first and second switches (320, 324) are shown to be provided by a bias and logic circuit 326. Control signals, supply voltage and grounding are shown to be provided for the bias and logic circuit 326 through various ports (e.g., DGND, VDD, C1, C2). Similarly, an RF ground is shown to be facilitated by an RFGND port.

In some embodiments, a silicon die (e.g., SOI die) having circuits for the first and second switches 320, 324, the LNAs 322a, 322b, 322c, and the bias and logic 326 (collective functionality depicted as dashed box 304) can be mounted on a packaging substrate in either wirebond or flip-chip configuration. The filters 102a, 102b, 102c (collective functionality depicted as dotted box 302) (and, in some embodiments, filters after the LNAs (322a, 322b, 322c)) can also be mounted on the same packaging substrate. In such a configuration, the overall area of a device (e.g., a module) having the band-selection switching circuit 300 will include areas occupied by the circuits, the filters, and related connection features.

Figure 8:
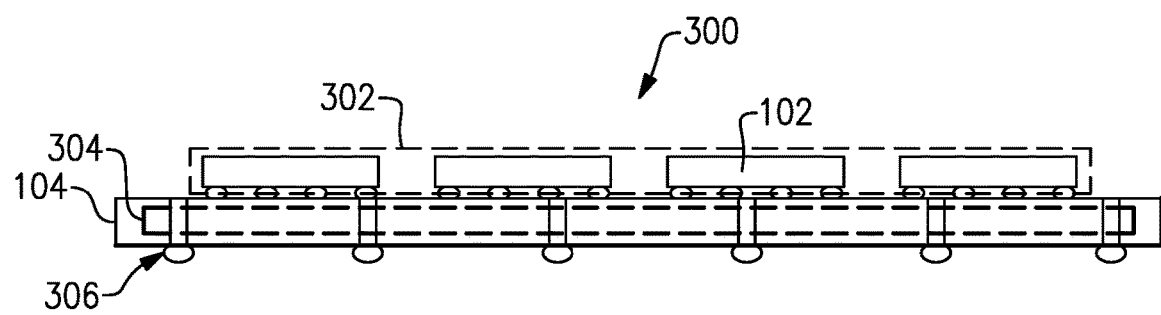
FIG. 8 shows that in some embodiments, a band-selection switching circuit having one or more filters on one side of an SOI die and the other side configured to be mountable can provide a number of advantageous features.

As described herein, and as shown in FIG. 8, a band-selection switching circuit 300 having one or more filters 102 on one side of an SOI die 104 and the other side configured to be mountable (e.g., flip-chip mount with bump solders 306) can provide a number of advantageous features, including significant reduction in the overall area of the circuit 300. For example, if the foregoing example configuration described in reference to FIG. 7 (where the filters are laid out next to the silicon die on the packaging substrate) occupies or requires a volume of approximately 3 mm (length)×4 mm (width) by 0.9 mm (height), it is estimated that the same circuit implemented in the configuration of FIG. 8 can occupy or require a reduced volume of approximately 1.3 mm (length)×1.5 mm (width) with a height of less than 0.6 mm. In terms of lateral area, the reduced area is about 16% of the 3 mm×4 mm example. In some embodiments, such a reduced lateral area can be, for example, 20% or less, 16% or less, or 13% or less than a lateral area associated with a configuration where the filters are laid out next to the silicon die on the packaging substrate. In terms of volume, the reduced volume is less than 11% of the 3 mm×4 mm×0.9 mm example. In some embodiments, such a reduced volume can be, for example, 20% or less, 15% or less, 13% or less, or 11% or less than a volume associated with a configuration where the filters are laid out next to the silicon die on the packaging substrate.

In the example band-selection switching circuit 300 of FIG. 7, circuits for the first and second switches 320, 324, the LNAs 322a, 322b, 322c, and the bias and logic 326 implemented on the silicon die are collectively depicted by the box 304. In the example of FIG. 8, some or all of such circuits having the same functionality (depicted as a box 304) can be implemented on and/or in the SOI die 104. The functionality of the filters 102a, 102b, 102c in the example of FIG. 7 is depicted by the box 302. In the example of FIG.

8, the same functionality (depicted as a box 302) can be implemented in the one or more filters 102 mounted on the SOI die 104.

In the context of the filters 102a, 102b, 102c being mounted on the same packaging substrate as the silicon die in FIG. 7, such a packaging substrate can be represented by a substrate 310. In the context of the filters 102a, 102b, 102c being mounted on the SOI die 104 in FIG. 8, the SOI die 104 itself can function as a packaging substrate suitable for mounting to a circuit board; and accordingly, the SOI die 104 can be represented by the substrate 310 of FIG. 7. Further, in the example of FIG. 8, the bump solders 306 can be electrically connected to the various ports (e.g., ANT, RFOUT, RFGND, DGND, VDD, C1, C2) associated with the band-selection switching circuit 300, as described in reference to FIG. 7.

Figure 9:
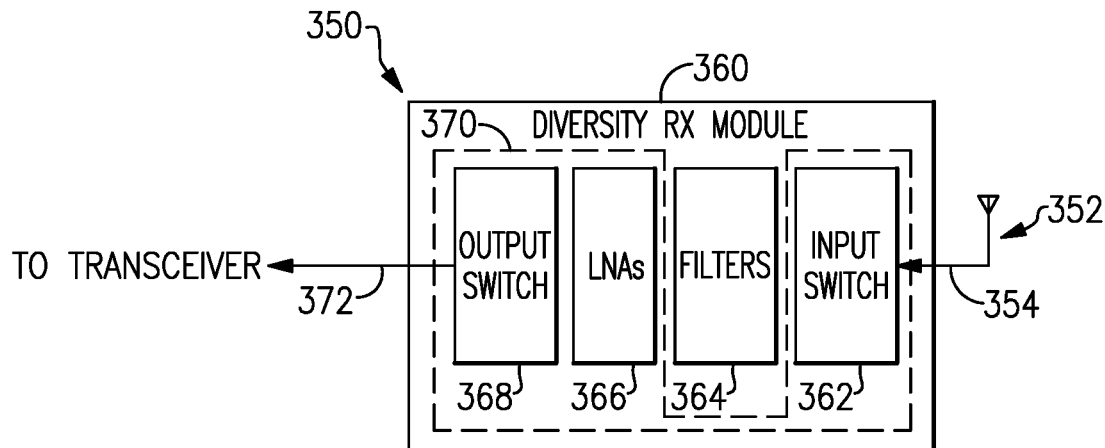
FIG. 9 shows an example of a diversity receive (RX) architecture in which one or more features as described herein can be implemented.

FIGS. 9-12 show another example where one or more features of the present disclosure can be implemented. FIG. 9 shows an example receive (RX) architecture 350 associated with a diversity antenna 352. Such a receive antenna is typically placed relatively far away from the main antenna; and both of the main antenna and the diversity antenna can be active at once to, for example, increase the data throughput. Due to the relatively remote location of the diversity antenna, its signal is usually attenuated by a lossy signal path (e.g., 372 in FIG. 9).

Accordingly, and as shown in FIG. 9, a diversity RX circuit 360 (e.g., in a module) can be implemented to add gain close to the diversity antenna 352. Thus, an RF signal received by the diversity antenna 352 can be provided to the diversity RX module 360 as an input (through path 354). The diversity RX module 360 can process the RF signal and provide the processed RF signal with a gain before being routed to a transceiver through the lossy signal path 372. The transceiver may or may not include an LNA to further amplify the RF signal received from the diversity RX module 360.

In the example of FIG. 9, the LNA associated with the transceiver, if any, may or may not be configured to include one or more features as described herein.

In the example of FIG. 9, the diversity RX module 360 can include input and output switches 362, 368 configured to provide band selection functionality for one or more LNAs 366. Filters 364 for the various frequency bands associated with the diversity RX module 360 can be provided between the input switch 362 and the LNA(s) 366.

In the example diversity RX module 360 of FIG. 9, circuits associated with the input and output switches 362, 368 and the LNAs 366 are collectively depicted by a box 370. As described herein, some of all of such circuits can be implemented on and/or in one or more SOI die. As also described herein, some or all of the filters 364 can be mounted on such one or more SOI die.

Figure 10:
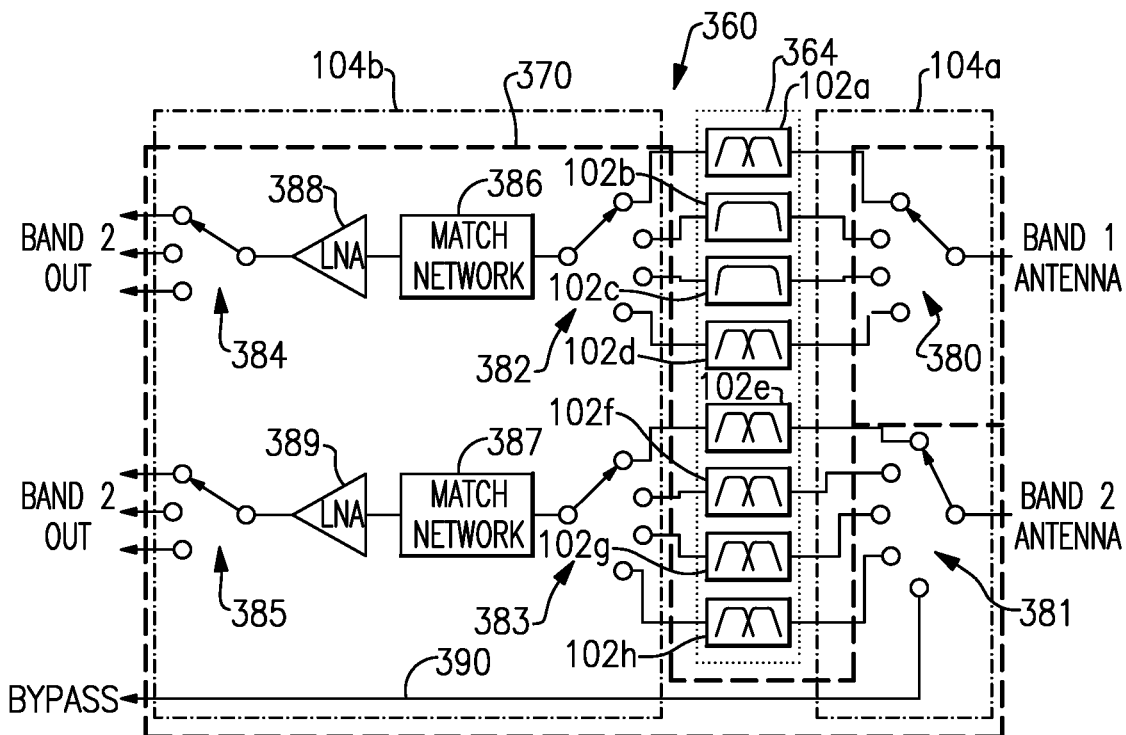
FIG. 10 shows a more detailed example of a diversity RX module that can be implemented for the architecture of FIG. 9.

FIG. 10 shows a diversity RX module 360 that can be a more specific example of the diversity RX module 360 of FIG. 9. In the example of FIG. 10, the diversity RX module 360 is depicted as being configured to process two groups of frequency bands, Band 1 and Band 2. For example, the Band 1 group can include high-band (HB) frequency bands, and the Band 2 group can include medium-band (MB) frequency bands. Filtering and/or duplexing functionalities associated with such bands are shown to be provided by filters/ duplexers 102a-102h, collectively indicated as 364. Tables 1 and 2 list examples of HB and MB frequency bands that can be implemented in the diversity RX module 360.

TABLE 1

| Filter/duplexer in FIG. 10 | Frequency band |
| --- | --- |
| 102a | B7 |
| 102b | B40 |
| 102c | B41 |
| 102d | B30 |

TABLE 2

| Filter/duplexer in FIG. 10 | Frequency band |
| --- | --- |
| 102e | B1 |
| 102f | B25 |
| 102g | B3 |
| 102h | B4 |

It will be understood that the diversity RX module 360 can be configured to process other frequency bands. It will also be understood that the diversity RX module 360 can also have more or less numbers of groups of frequency bands (e.g., more than two or less than two groups).

In the example of FIG. 10, routing of signals associated with the filters/duplexers 102a-102d for the Band 1 group can be facilitated by switches 380, 382 before and after the filters/duplexers 102a-102d, respectively, and a switch 384 after a first LNA 388. The switch 380 can be configured to provide, for example, a single-pole-4-throw (SP4T) functionality, with the pole receiving an RF signal from the Band 1 antenna. The four throws can allow routing of the RF signal to a selected one of the filters/duplexers 102a-102d. Similarly, the switch 382 can be configured to provide, for example, a single-pole-4-throw (SP4T) functionality, with the pole being coupled to the first LNA 388 through a corresponding match network 386. The four throws of the switch 382 can operate with the switch 380 to receive the RF signal from the selected one of the filters/duplexers 102a-102d, so as to route the filtered signal to the first LNA 388. The output of the first LNA 388 can be routed to one or more output paths. In the example, three output paths are shown, and selection of one of such paths can be facilitated by, for example, the switch 384 being configured as an SP3T switch.

Similarly, routing of signals associated with the filters/ duplexers 102e-102h for the Band 2 group can be facilitated by switches 381, 383 before and after the filters/duplexers 102e-102h, respectively, and a switch 385 after a first LNA 389. The switch 381 can be configured to provide, for example, a single-pole-5-throw (SP5T) functionality, with the pole receiving an RF signal from the Band 2 antenna. Four of the five throws can allow routing of the RF signal to a selected one of the filters/duplexers 102e-102h, and the fifth throw can be utilized to provide a bypass route 390. The switch 383 can be configured to provide, for example, an SP4T functionality, with the pole being coupled to the second LNA 389 through a corresponding match network 387. The four throws of the switch 383 can operate with the switch 381 to receive the RF signal from the selected one of the filters/duplexers 102e-102h, so as to route the filtered signal to the second LNA 389. The output of the second LNA 389 can be routed to one or more output paths. In the example, three output paths are shown, and selection of one of such paths can be facilitated by, for example, the switch 385 being configured as an SP3T switch.

In the example of FIG. 10, each of the example switches 382 and 384 associated with the Band 1 group is depicted as having a single pole and a plurality of throws. Similarly, each of the example switches 383 and 385 associated with the Band 2 group is depicted as having a single pole and a plurality of throws. It will be understood that some or all of such switches can include more than one pole. For example, the switches 382 and 383, individually or in any combination, can include a plurality of poles that are coupled to inputs of different LNAs. In another example, the switches 384 and 385, individually or in any combination, can include a plurality of poles that allow LNA outputs to be routed to one or more module outputs.

The foregoing switching configuration can provide flexibility in Rx architecture. For example, instead of implementing one LNA for multiple bands, a plurality of LNAs can be implemented utilizing the foregoing switching configuration. Use of such LNAs can reduce the frequency coverage range of each LNA and thereby improve performance.

The diversity RX module 360 of FIG. 10 is an example of how one or more features of the present disclosure can be implemented in various modules. It will be understood that one or more features of the present disclosure can also be implemented in other types of modules. For example, a power amplifier (PA) module can benefit from one or more features as described herein. Such a PA module can have an architecture similar to the example of FIG. 10, but with the amplification direction reversed such that LNA functionality is replaced with PA functionality. In another example, any modules that utilize, for example, SOI switch(es), passive component(s) and resonator(s) (e.g., SAW resonator(s)) can benefit from one or more features of the present disclosure. In such modules, a configuration in which any type of filter or resonator is stacked relative to (e.g., above) an SOI switch, LNA, PA or any circuit block can be implemented.

In the example of FIG. 10, circuits associated with the switches 380, 381, 382, 383, 384, 385, the LNAs 388, 389, and the match networks 386, 387 are collectively depicted by a box 370, similar to the box 370 of FIG. 9. As described herein, some of all of such circuits can be implemented on and/or in one or more SOI die. For example, some of all of such circuits can be implemented on a single SOI die 104, as in the example of FIG. 11. In another example, some of all of the circuits before the filters/duplexers 364 can be implemented on a first SOI die 104a, and some of all of the circuits after the filters/duplexers 364 can be implemented on a second SOI die 104b as in the example of FIG. 12.

As also described herein, some or all of the filters/duplexers 364 can be mounted on such one or more SOI die. For example, if substantially all of the circuits associated with the box 370 are implemented on and/or in a single SOI die, then all eight of the filters/duplexers 102a-102h can be mounted on such a single SOI die. In another example, if the circuits associated with the box 370 are implemented on and/or in first and second SOI die, then the eight filters/duplexers 102a-102h can be mounted on the first SOI die, on the second SOI die, or on both die.

Figure 11:
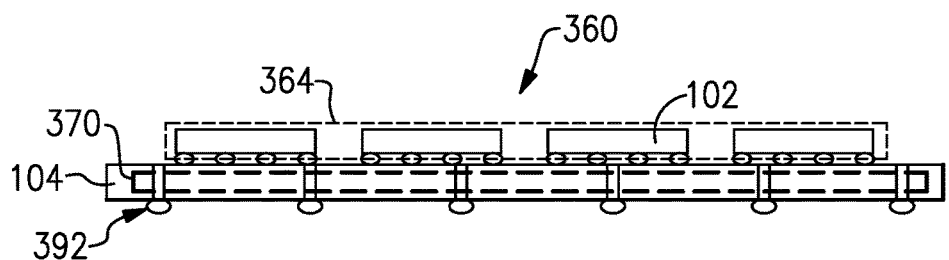
FIG. 11 shows that in some embodiments, the diversity RX module of FIG. 10 can be implemented in a configuration having some or all filters mounted on one side of a single SOI die and the other side configured to be mountable.

FIG. 11 shows an example of the diversity RX module 360 of FIG. 10, in which circuits associated with the box 370 (in FIG. 10) can be implemented in and/or on a single silicon die such as a single SOI die 104. In FIG. 11, such circuits are also collectively depicted by a box 370. The functionality of the filters/duplexers 102a-102h in the example of FIG. 10 is depicted by the box 364. In the example of FIG. 11, the same functionality (depicted as a box 364) can be implemented in a plurality of filters/duplexers 102 mounted on the single SOI die 104.

Figure 12:
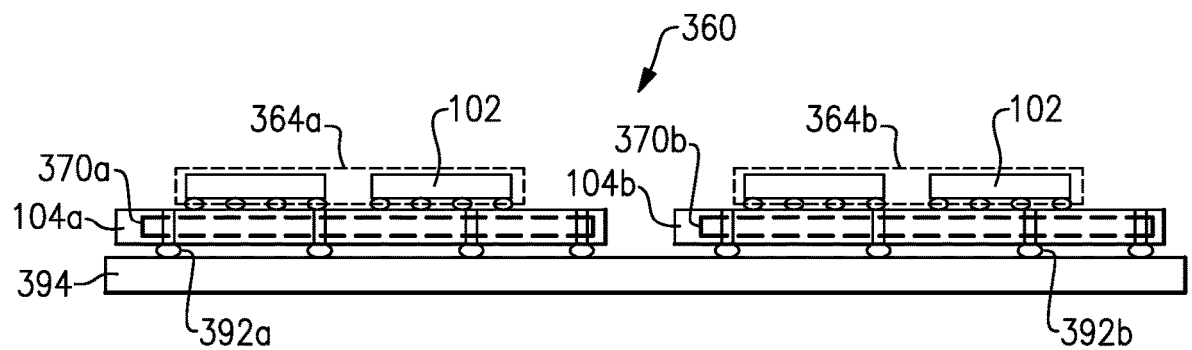
FIG. 12 shows that in some embodiments, the diversity RX module of FIG. 10 can be implemented in a configuration having filters mounted on some or all of a plurality of SOI die.

FIG. 12 shows an example of the diversity RX module 360 of FIG. 10, in which circuits associated with the box 370 (in FIG. 10) can be implemented in and/or on a plurality of silicon die such as a plurality of SOI die 104a, 104b. In FIG. 12, such circuits are also collectively depicted by boxes 370a, 370b. The functionality of the filters/duplexers 102a-102h in the example of FIG. 10 is depicted by the box 364. In the example of FIG. 12, the same functionality (depicted as boxes 364a, 364b) can be implemented in a plurality of filters/duplexers 102 mounted on the corresponding SOI die 104.

Figure 13:
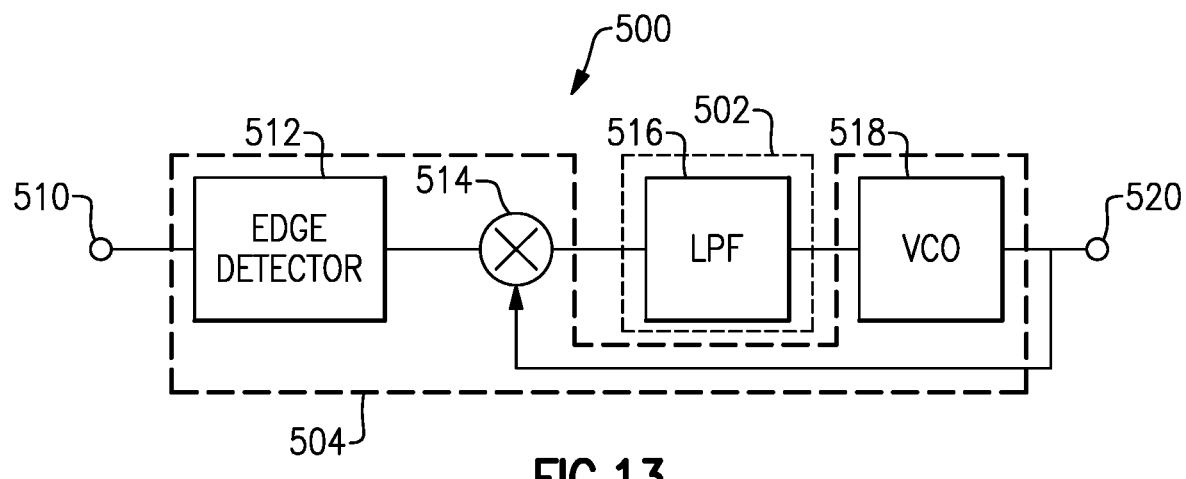
FIG. 13 shows an example of a clock recovery circuit configured to generate a timing signal from an input of data signal.
Figure 14:
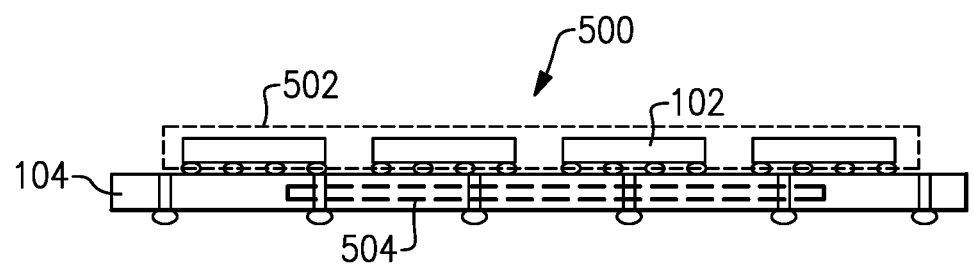
FIG. 14 shows that some or all of the clock recovery circuit of FIG. 11 can be implemented in a configuration having one or more filters mounted on one side of a semiconductor die and the other side configured to be mountable.

FIGS. 13 and 14 show yet another example where one or more features of the present disclosure can be implemented. FIG. 13 shows a diagram of an example clock recovery circuit 500 configured to generate a timing signal (at node 520) from an input of data signal (at node 510). To achieve such functionality, an integrated circuit (IC) 504 including an edge detector 512, a mixer 514, and a voltage controlled oscillator (VCO) 518 can be configured as shown, along with a filter circuit 502 including a low-pass filter (LPF) 516.

FIG. 14 shows that some or all of the clock recovery circuit 500 of FIG. 13 can be implemented in a configuration having one or more filters 102 mounted on one side of a semiconductor die 104 (e.g., BiCMOS die) and the other side configured to be mountable (e.g., flip-chip mount with bump solders). As described herein, such a configuration of FIG. 14 can provide a number of advantageous features, including significant reduction in the overall area of the circuit 500.

In the example clock recovery circuit 500 of FIG. 14, some or all of the IC 504 can be implemented on the semiconductor die 104. Some or all of the filter circuit 502 can be implemented in one or more of the filters 102 mounted on the semiconductor die 104.

In the various examples described herein, a passive component can include a resistance element such as a resistor, a capacitance element such as a capacitor, an inductance element such as an inductor, or any combination thereof.

It will be understood that implementations of one or more features of the present disclosure in other types of RF circuits are also possible.

In some implementations, various examples described herein in reference to FIGS. 7-14 can be viewed as a compact assembly of a circuit and a signal conditioning component, for which complete integration on one process technology platform is not practical and/or not desirable. As described herein, such a compact assembly can provide benefits associated with having the signal conditioning component(s) (e.g., filters) in close proximity to the circuit(s) (e.g., an active circuit). Such benefits can include, for example, minimizing signal loss between the circuit and the signal conditioning component(s).

In some implementations, a device and/or a circuit having one or more features described herein can be included in an RF device such as a wireless device. Such a device and/or a circuit can be implemented directly in the wireless device, in a modular form as described herein, or in some combination thereof. In some embodiments, such a wireless device can include, for example, a base station configured to provide wireless services, a cellular phone, a smart-phone, a hand-held wireless device with or without phone functionality, a wireless tablet, etc.

Figure 15:
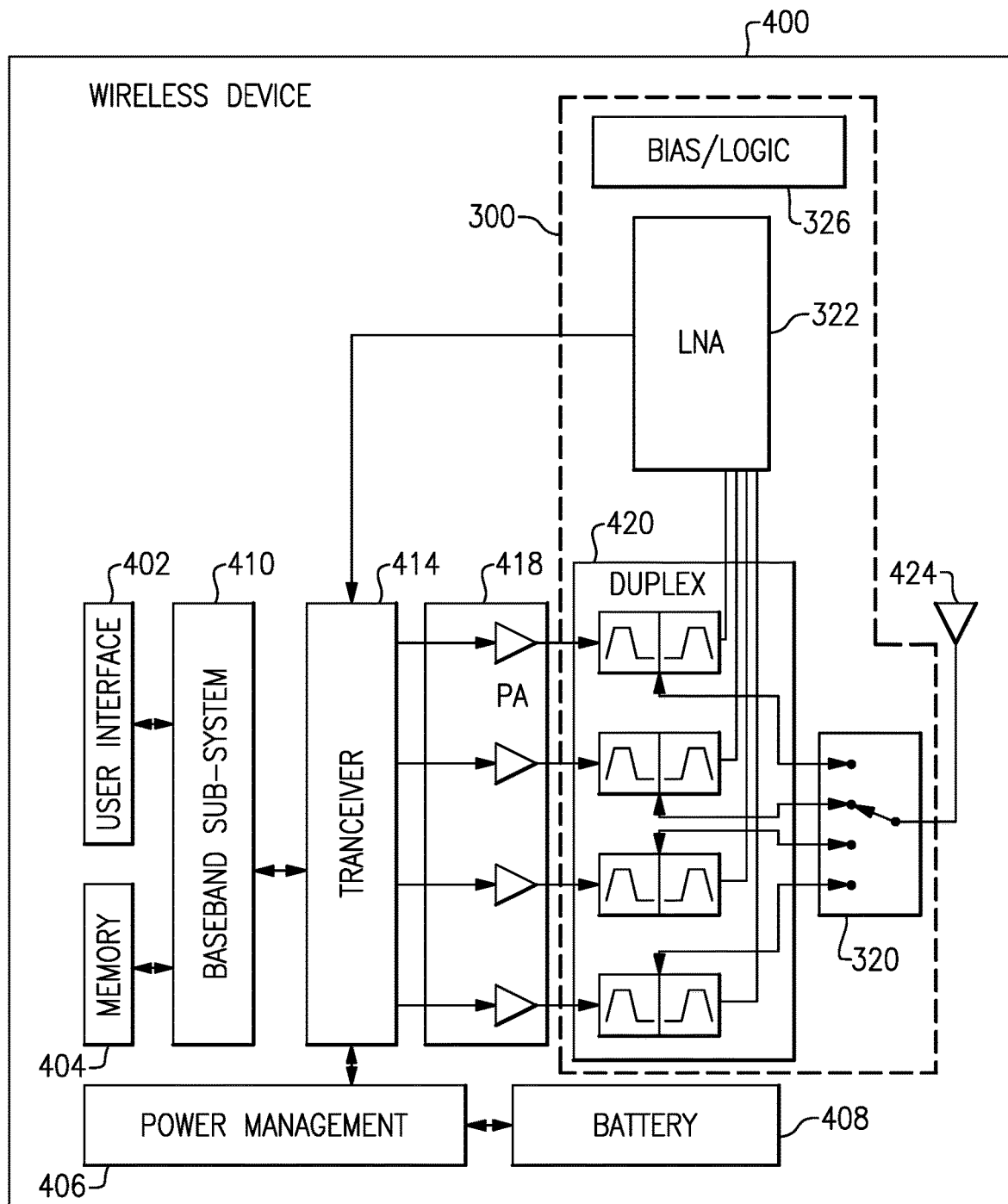
FIG. 15 schematically depicts an example wireless device having one or more advantageous features described herein.

FIG. 15 depicts an example wireless device 400 having one or more advantageous features described herein. In the context of various configurations as described herein, a front-end module having functionality depicted as 300 can be a part of the wireless device. In some embodiments, such a front-end module may or may not include a power amplifier (PA) circuit 418, an LNA 322, and/or a bias/logic circuit 326. In the context of the example configuration 300 of FIGS. 7 and 8, components such as switching circuits associated with a band-selection switch 320, as well as filters associated with a duplexer circuit 420 can be implemented in the front-end module. In some embodiments, the wireless device 400 can include a diversity RX module having one or more features as described herein.

In the example wireless device 400, the PA circuit 418 having a plurality of PAs can provide an amplified RF signal to the switch 320 (via the duplexer 420), and the switch 320 can route the amplified RF signal to an antenna 424. The PA circuit 418 can receive an unamplified RF signal from a transceiver 414 that can be configured and operated in known manners.

The transceiver 414 can also be configured to process received signals. Such received signals can be routed to the LNA 322 from the antenna 424, through the duplexer 420. Various operations of the LNA 322 can be facilitated by the bias/logic circuit 326.

The transceiver 414 is shown to interact with a baseband sub-system 410 that is configured to provide conversion between data and/or voice signals suitable for a user and RF signals suitable for the transceiver 414. The transceiver 414 is also shown to be connected to a power management component 406 that is configured to manage power for the operation of the wireless device 400. Such a power management component can also control operations of the baseband sub-system 410 and the front-end module.

The baseband sub-system 410 is shown to be connected to a user interface 402 to facilitate various input and output of voice and/or data provided to and received from the user. The baseband sub-system 410 can also be connected to a memory 404 that is configured to store data and/or instructions to facilitate the operation of the wireless device, and/or to provide storage of information for the user.

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

One or more features of the present disclosure can be implemented with various cellular frequency bands as described herein. Examples of such bands are listed in Table 3. It will be understood that at least some of the bands can be divided into sub-bands. It will also be understood that one or more features of the present disclosure can be implemented with frequency ranges that do not have designations such as the examples of Table 3.

TABLE 3

| Band | Mode | Tx Frequency Range (MHz) | Rx Frequency Range (MHz) |
| --- | --- | --- | --- |
| B1 | FDD | 1,920-1,980 | 2,110-2,170 |
| B2 | FDD | 1,850-1,910 | 1,930-1,990 |
| B3 | FDD | 1,710-1,785 | 1,805-1,880 |
| B4 | FDD | 1,710-1,755 | 2,110-2,155 |
| B5 | FDD | 824-849 | 869-894 |
| B6 | FDD | 830-840 | 875-885 |
| B7 | FDD | 2,500-2,570 | 2,620-2,690 |
| B8 | FDD | 880-915 | 925-960 |
| B9 | FDD | 1,749.9-1,784.9 | 1,844.9-1,879.9 |
| B10 | FDD | 1,710-1,770 | 2,110-2,170 |
| B11 | FDD | 1,427.9-1,447.9 | 1,475.9-1,495.9 |
| B12 | FDD | 699-716 | 729-746 |

TABLE 3-continued

| Band | Mode | Tx Frequency Range (MHz) | Rx Frequency Range (MHz) |
| --- | --- | --- | --- |
| B13 | FDD | 777-787 | 746-756 |
| B14 | FDD | 788-798 | 758-768 |
| B15 | FDD | 1,900-1,920 | 2,600-2,620 |
| B16 | FDD | 2,010-2,025 | 2,585-2,600 |
| B17 | FDD | 704-716 | 734-746 |
| B18 | FDD | 815-830 | 860-875 |
| B19 | FDD | 830-845 | 875-890 |
| B20 | FDD | 832-862 | 791-821 |
| B21 | FDD | 1,447.9-1,462.9 | 1,495.9-1,510.9 |
| B22 | FDD | 3,410-3,490 | 3,510-3,590 |
| B23 | FDD | 2,000-2,020 | 2,180-2,200 |
| B24 | FDD | 1,626.5-1,660.5 | 1,525-1,559 |
| B25 | FDD | 1,850-1,915 | 1,930-1,995 |
| B26 | FDD | 814-849 | 859-894 |
| B27 | FDD | 807-824 | 852-869 |
| B28 | FDD | 703-748 | 758-803 |
| B29 | FDD | N/A | 716-728 |
| B30 | FDD | 2,305-2,315 | 2,350-2,360 |
| B31 | FDD | 452.5-457.5 | 462.5-467.5 |
| B33 | TDD | 1,900-1,920 | 1,900-1,920 |
| B34 | TDD | 2,010-2,025 | 2,010-2,025 |
| B35 | TDD | 1,850-1,910 | 1,850-1,910 |
| B36 | TDD | 1,930-1,990 | 1,930-1,990 |
| B37 | TDD | 1,910-1,930 | 1,910-1,930 |
| B38 | TDD | 2,570-2,620 | 2,570-2,620 |
| B39 | TDD | 1,880-1,920 | 1,880-1,920 |
| B40 | TDD | 2,300-2,400 | 2,300-2,400 |
| B41 | TDD | 2,496-2,690 | 2,496-2,690 |
| B42 | TDD | 3,400-3,600 | 3,400-3,600 |
| B43 | TDD | 3,600-3,800 | 3,600-3,800 |
| B44 | TDD | 703-803 | 703-803 |

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A method of manufacturing a radio-frequency device, comprising:
   providing a semiconductor die including a radio-frequency circuit, a first side and a second side, and a plurality of vias, each via configured to provide an electrical connection between the first side and the second side of the semiconductor die; and
   mounting a filter device on the first side of the semiconductor die, the filter device in communication with the radio-frequency circuit, the radio-frequency circuit implemented in a layer on the first side of the semiconductor die and at least some of the vias coupled with the radio-frequency circuit to support an electrical connection between the radio-frequency circuit and mounting features on the second side of the semiconductor die.

2. The method of claim 1 wherein the second side of the semiconductor die is configured to be mountable in a flip-chip manner.

3. The method of claim 2 wherein the second side of the semiconductor die includes a plurality of bump solders, at least some of the bump solders electrically connected to respective ones of the plurality of vias.

4. The method of claim 2 wherein the semiconductor die includes a silicon-on-insulator substrate, the silicon-on-insulator substrate including an insulator layer interposed between an active silicon layer and a silicon substrate layer.

5. The method of claim 1 wherein the radio-frequency circuit further includes a switch circuit.

6. The method of claim 5 wherein the radio-frequency circuit further includes a logic circuit for the switch circuit.

7. The method of claim 6 wherein the radio-frequency circuit further includes one or more of a low-noise amplifier circuit and a power amplifier circuit.

8. The method of claim 6 wherein the radio-frequency circuit includes a band-selection circuit configured to route a received radio-frequency signal to a selected low-noise amplifier.

9. The method of claim 8 wherein the received radio-frequency signal is routed through the filter device prior to the selected low-noise amplifier.

10. The method of claim 8 wherein the received radio-frequency signal is routed through the filter device after the selected low-noise amplifier.

11. The method of claim 8 wherein the radio-frequency circuit is part of a diversity receive module.

12. The method of claim 1 wherein the filter device is an acoustic filter.

13. A method of manufacturing a radio-frequency module, comprising:
   providing a packaging substrate configured to receive a plurality of components; and
   mounting a wafer level chip scale package on the packaging substrate, the wafer level chip scale package having a silicon die that includes a radio-frequency circuit, a first side and a second side, and a plurality of vias, each via configured to provide an electrical connection between the first side and the second side of the silicon die, the wafer level chip scale package further including a filter device mounted on the first side of the silicon die, the filter device in communication with the radio-frequency circuit, the radio-frequency circuit implemented in an active layer on the first side of the silicon die and at least some of the vias coupled with the radio-frequency circuit to facilitate an electrical connection between the radio-frequency circuit and mounting features on the second side of the silicon die, the radio-frequency circuit of the silicon die including a switch circuit.

14. The method of claim 13 wherein the wafer level chip scale package has a lateral dimension that is less than 20% of a lateral area of a package with a silicon die with a similar radio-frequency circuit and a similar number of filter devices mounted on a packaging substrate instead of the silicon die.

15. The method of claim 14 wherein the wafer level chip scale package has a height that is less than the height of the package.

16. The method of claim 13 wherein the filter device is an acoustic filter.

17. The method of claim 13 wherein the radio-frequency module is a diversity receive module.

18. A method of manufacturing a wireless device, comprising:
   providing an antenna configured to receive a radio-frequency signal;
   providing a receiver in communication with the antenna, the receiver configured to process the received radio-frequency signal; and
   providing a radio-frequency module configured to route the received radio-frequency signal from the antenna to the receiver, the radio-frequency module including a wafer level chip scale package, the wafer level chip scale package having a semiconductor die that includes a radio-frequency circuit, a first side and a second side, and a plurality of vias, each via configured to provide an electrical connection between the first side and the second side of the semiconductor die, the wafer level chip scale package further including a filter device mounted on the first side of the semiconductor die, the filter device in communication with the radio-frequency circuit, the radio-frequency circuit implemented in a layer on the first side of the semiconductor die and at least some of the vias coupled with the radio-frequency circuit to support an electrical connection between the radio-frequency circuit and mounting features on the second side of the semiconductor die.

19. The method of claim 18 wherein the filter device is an acoustic filter.

20. The method of claim 18 wherein the radio-frequency module is a diversity receive module.

* * * * *